US006420090B1

(12) United States Patent
Kojima et al.

(10) Patent No.: US 6,420,090 B1
(45) Date of Patent: Jul. 16, 2002

(54) LIQUID PHOTOCURABLE COMPOSITION, WATER-BASED PHOTOCURABLE COMPOSITION AND RESIST PATTERN-FORMING METHOD BY USE OF THE SAME

(75) Inventors: Daisuke Kojima; Genji Imai; Jun Akui; Hideo Kogure; Osamu Isozaki, all of Kanagawa-ken (JP)

(73) Assignee: Kansai Paint Co., Ltd. (JP)

(*) Notice: Subject to any disclaimer, the term of this patent is extended or adjusted under 35 U.S.C. 154(b) by 0 days.

(21) Appl. No.: 09/453,504

(22) Filed: Dec. 3, 1999

(30) Foreign Application Priority Data

Dec. 4, 1998 (JP) ............................................ 10-345047

(51) Int. Cl.$^7$ ............................................ G03F 7/037
(52) U.S. Cl. ................ 430/284.1; 430/283.1; 430/287.1; 430/325; 522/66
(58) Field of Search ............ 430/283.1, 284.1, 430/325, 287.1; 522/96, 66

(56) References Cited

U.S. PATENT DOCUMENTS 5,290,663 A * 3/1994 Huynh-Tran ................ 430/284
6,159,658 A * 12/2000 Tanaka et al. ............ 430/283.1

FOREIGN PATENT DOCUMENTS

| EP | 0152377 | 8/1985 |
| JP | 63-221110 | 9/1988 |
| JP | 2-20873 | 1/1990 |
| JP | 3-137176 | 6/1990 |
| JP | 3-223759 | 10/1991 |
| JP | 5-241338 | 9/1993 |
| JP | 6-136077 | 5/1994 |
| JP | 6-321895 | 11/1994 |
| JP | 7-5885 | 1/1995 |
| JP | 7-102037 | 4/1995 |
| JP | 7-225474 | 8/1995 |

* cited by examiner

Primary Examiner—Rosemary Ashton
(74) Attorney, Agent, or Firm—Fisher, Christen & Sabol

(57) ABSTRACT

A liquid photocurable composition containing a photopolymerizable polyurethane compound having a repeating unit represented by the following formula: $B-[X]_n[Y]_m-B$, where X is represented by the formula:

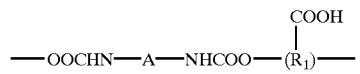

and Y is represented by the formula: $-OOCHN-A-NHCOO(R_2)-$, A is a structural unit derived from a polyisocyanate compound, B is same or different and a structural unit derived from a hydroxy compound having at least one photopolymerizable unsaturated group at molecular terminals respectively and optionally containing an ether linkage, $R_1$ is a structural unit derived from a carboxyl group-containing polyol compound, $R_2$ is a structural unit derived from a polyol compound, n is an integer of 1 to 10, m is an integer of 1 to 10, provided that one X and one Y are bonded to each other, or three or more of X and/or Y are bonded to each other, and optionally containing a photopolymerizable compound other than the photopolymerizable polyurethane compound.

10 Claims, No Drawings

LIQUID PHOTOCURABLE COMPOSITION, WATER-BASED PHOTOCURABLE COMPOSITION AND RESIST PATTERN-FORMING METHOD BY USE OF THE SAME

This application has priority benefit of Japanese Patent Application No. 98/345047, filed on Dec. 4, 1998.

BACKGROUND ART

(1) Field of the Invention

The present invention relates to a liquid photocurable composition and a water-based photocurable composition, and particularly to a photocurable composition for use in a printed circuit board. The liquid photocurable composition and water-based photocurable composition of the present invention is applicable to a solder resist, etching resist, anti-plating resist, UV ink and the like.

(2) Description of Background Art

A method of forming a conductor circuit such as a printed circuit board is known in the art, which comprises coating a photocurable resist composition onto a board, followed by exposing to light, developing to form a resist pattern, and by etching to remove unnecessary portion.

For example, a photocurable resist composition capable of developing with a weak alkali by use of an unsaturated resin having carboxyl group is known as the above photocurable resist composition (see Japanese Patent Application Laid-Open No. 223759/91).

The above carboxyl group-containing unsaturated resin is usually prepared as described in the above prior art by a process which comprises subjecting an acid unsaturated monomer such as acrylic acid with alkyl (meth)acrylate monomer to a radical copolymerization reaction to obtain a polycaroxylic acid resin, followed by subjecting the resin and an epoxy group-containing unsaturated monomer such as glycidyl (meth)acrylate to an addition reaction of a part of the carboxyl group-containing alkyl (meth)acrylate monomer with glycidyl group.

The use of the above acid resin as an alkali development type resist composition had such problems (1) that a broad molecular weight distribution of the acid resin prepared by the radical polymerization reaction causes a reduction of solubility due to an alkali developing solution or etching solution in a high molecular weight region and an increase of solubility due to the alkali developing solution or etching solution in a low molecular weight region, resulting in making it impossible to carry out a uniform developing treatment or etching treatment, (2) that difference of a radical copolymerization reaction speed between a (meth)acrylic acid monomer component and alkyl (meth)acrylate monomer may produce a homopolymer of the acrylic acid monomer or an acrylic resin containing the acrylic acid component in a small amount, resulting in that formation of a fine resist pattern is made impossible due to non-uniform speed of removing the resist film by the alkali developing treatment, remaining of the resist film in a short period of treating time, and to erosion and washing out of a photo-cured film, (3) that heating on the addition reaction between the polycarboxylic acid resin and the epoxy group-containing unsaturated monomer further increases molecular weight of the polycarboxylic acid resin, (4) that unnecessary presence with the resin of a radical polymerization inhibitor usually added for the purpose of inhibiting the radical polymerization reaction unsaturated groups on the addition reaction reduces reactivity of the photopolymerization reaction, and (5) that erosion and washing out of the photocured film by the etching solution due to unsatisfactory properties of the photocured film makes it impossible to form a fine resist pattern.

As a method of introducing an unsaturated group into the resin, in addition to the above method, for example, Japanese Patent Appliction Laid-Open No. 102037/95 discloses a process for preparing a water-soluble actinic radiation-curable resin which comprises reacting a polyhydroxy compound, radically polymerizable unsaturated group-containing polyhydroxy compound, anionic hydrophilic group-containing polyhydroxy compound, polyisocyanate compound and radically polymerizable unsaturated group-containing monohydroxy compound to obtain a polyurethane resin, followed by neutralizing with an amine. However, use of the above water-soluble polyurethane resin as a resist composition produced such problems that poor alkali developing properties and anti-etching properties make it impossible to form a fine resist pattern.

As another method of introducing an unsaturated group into the resin, Japanese Patent Application Laid-Open No. 136077/94 discloses a radiation-curable resin composition prepared by reacting a reaction product of dimethylol propionic acid with ε-caprolactone, organic polyisocyanate compound and hydroxyl group-containing (meth)acrylate. However, use of the above resin composition as the resist composition had problems of poor properties in alkali developing properties, anti-etching properties and the like.

SUMMARY OF THE INVENTION

It is an object of the present invention to provide a liquid or water-based photocurable composition showing good properties in alkali developing properties, anti-etching resist properties and capable of forming a fine pattern.

It is another object of the present invention to provide a method of forming a fine pattern by use of the liquid or water-based photo curable composition.

That is, the present invention provides, in a first embodiment, a liquid photocurable composition containing a photopolymerizable polyurethane compound having a repeating unit represented by the following formula: B—[X]$_n$ [Y]$_m$—B, where X is represented by the formula:

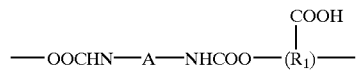

and Y is represented by the formula: —OOCHN—A—NHCOO(R$_2$)—, A is a structural unit derived from a polyisocyanate compound, B is same or different and a structural unit derived from a hydroxy compound having at least one photopolymerizable unsaturated group at molecular terminals respectively and optionally containing an ether linkage, R$_1$ is a structural unit derived from a carboxyl group-containing polyol compound, R$_2$ is a structural unit derived from a polyol compound, n is an integer of 1 to 10, m is an integer of 1 to 10, provided that one X and one Y are bonded to each other, or three or more of X and/or Y are bonded to each other, and optionally containing a photopolymerizable compound other than the photopolymerizable polyurethane compound.

The present invention provides, in a second embodiment, a water-based photocurable composition prepared by dispersing the liquid photocurable composition in the first embodiment of the present invention.

The present invention provides, in a third embodiment, a method of forming a resist pattern comprising the following steps: (1) coating the liquid photocurable composition or the water-based photocurable composition onto a substrate to form a photocurable resist film, (2) exposing the photocurable resist film directly to a laser beam or through a negative mask to light for curing so that a resist film having a predetermined printed image can be formed; and (3) carrying out an alkali developing treatment to form a resist pattern on the substrate.

DETAILED DESCRIPTION OF THE INVENTION

The photopolymerizable polyurethane compound used in the present invention is a compound represented by the above formulas. Respective compounds, from which respective structural units in the above formulas are formed, are a polyisocyanate compound, hydroxy compound having at least one photocurable unsaturated group at molecular terminals, carboxyl group-containing polyol compound and polyol compound respectively these compounds are explained hereinafter.

The polyisocyanate compound is used for bonding a compound introducing carboxyl group into the molecule to a compound introducing photopolymerizable unsaturated group at molecular terminals.

The polyisocyanate compound may include aliphatic diisocyanate compound such as hexamethylene diisocyanate, trimethylenediisocyanate, 1,4-tetramethylenediisocyanate, pentamethylenediisocyanate, 1,2-propylenediisocyanate, 1,2-butylene-diisocyanate, trimethylhexamethylene diisocyanate, dimer acid diisocyanate, lysinediisocyanate, 2,3-butylenediisocyanate, 1,3-butylenediisocyanate and the like; alicyclic diisocyanate compound such as isophoronediisocyanate, 4,4'-methylene bis (cyclohexylisocyanate), methylcyclohexane-2,4-(or -2,6-) diisocyanate, 1,3-(or 1,4-)-di(isocyanatomethyl) cyclohexane, 1,4-cyclohexanediisocyanate, 1,3-cyclopentanediisocyanate, 1,2-cyclohexanediisocyanate and the like; aromatic diisocyanate compound such as xylylenediisocyanate, methaxylylene diisocyanate, tetramethylxylylenediisocyanate, tolylenediisocyanate, 4,4'-diphenyl-methanediisocyanate, 1,5-naphthalenediisocyanate, 1,4-naphthalenediisocyanate, 4,4'-toluidinediisocyanate, 4,4'-diphenyletherdiisocyanate, (m- or p-) phenylenediisocyanate, 4,4'-biphenylenediisocyanate, 3,3'-dimethyl-4,4'-biphenylenediisocyanate, bis(4-isocyanatophenyl) sulfone, isopropylidene bis(4-phenylisocyanate) and the like; other polyisocyanates, for example, polyisocyanate compounds having three or more isocyanate group such as triphenylmethane -4,4',4"-triisocyanate, 1,3,5-triisocyanatobenzene, 2,4,6-triisocyanatotoluene, 4,4'-dimethyldiphenylmethane-2,2',5, 5'-tetraisocyanate and the like, adducts prepared by reacting a polyol such as ethylene glycol, propylene glycol, 1,4-butylene glycol, polyalkylene glycol, trimethylolpropane, hexanetriol and the like with a polyisocyanate compound in an excess amount of isocyanate group relative to hydroxy group in the polyol, biuret type adducts of hexamethyllenediisocyanate, isophoronediisocyanate, tolylenediisocyanate, xylylenediisocyanate, 4,4'-diphenylmethanediisocyanate, 4,4'-methylene bis (cyclohexylisocyanate) and the like, isocyanuric ring type adducts, and the like. These compounds may be used alone or in combination. Of these, aromatic diisocyanate compounds are preferable, because the aromatic diisocyanate compound is hardly hydrolyzed to the alkaki developing solution and is capable of forming a photocured film, which has high resistance to the alkaki developing solution and etching solution, and which is so tough as to be sufficiently adhered without being separated from the substrate by an external force such as the etching solution and the like until the photocured resist film is removed in the resist pattern forming method.

The hydroxy compound having at least one photopolymerizable unsaturated group at molecular terminals is a compound used for introducing the photopolymerizable unsaturated group to the molecular terminals.

The photopolymerizable unsaturated group is an unsaturated group which is subjected to a radical polymerization reaction by light to form a crosslinked structure and may include unsaturated groups known in the art. Of these, (meth)acryloyl group is particularly preferable.

The hydroxy compound may include ones prepared by reacting one mole of polyhydric alcohol with one mole or more of an unsaturated acid so that hydroxyl group may remain after reaction. Specific examples thereof may include hydroxy compounds containing respectively one unsaturated group in one molecule of hydroxyethyl (meth) acrylate, hydroxypropyl (meth)acrylate, hydroxymethyl (meth) acrylate, (poly)ethylene glycol mono(meth)acrylate, (poly) propylene glycol mono (meth) acrylate, 1,6-hexanediol mono(meth)acrylate and the like; hydroxy compounds containing respectively two or more unsaturated groups in one molecule of glycerine di(meth)acrylate, diglycerine di(meth)acrylate, diglycerine tri(meth)acrylate, trimethylolpropane (meth)acrylate, pentaerythritol (meth)acrylate, pentaerythritol tri(meth)acrylate, dipentaerythritol di(meth) acrylate, hydroxyisocyanurate di(meth)acrylate, sorbitol di(meth)acrylate and the like; and the like. These may be used alone or in combination. Of these, the hydroxy compounds containing two or more of unsaturated group are preferable.

The carboxyl group-containing polyol compound is such that introduction of carboxyl group into the molecule makes it possible to remove a non-irradiated resist film by the alkali developing treatment.

The carboxyl group-containing polyol compound may include compounds containing at least one carboxyl group and two or more hydroxy groups in the molecule. Specific examples thereof may include, for example, semiester compounds prepared by reacting 2,2-dimethylol propionic acid, 2,2-dimethylol acetic acid, 2,2-dimethylol pentanic acid, or triol compounds with an acid anhydride; sulfonate diol compounds prepared by subjecting sodium dimethylsulfoisophthalate and glycols to ester exchange reaction in the presence of an excess amount of the glycols; and the like. These may be used alone or in combination.

In the above formulas representing the photopolymerizable polyurethane compound, n is in the range of 1 to 10, preferably 1 to 5. When n is less than 1, the alkali developing treatment is made impossible. When n is more than 10, a resist sensitivity and the like may be reduced. Usually, the photopolymerizable polyurethane compound has a number average molecular weight in the range of about 1000 to 20000.

The polyol compound is such that a hydrophobic group free of carboxyl group in the molecule is introduced into a molecular backbone so as to control a balance between hydrophilic properties and hydrophobic properties in the polyurethane compound. On the other hand, polyalkylene glycol having a number average molecular weight in the range of about 500 to 5000 or the like per se provides hydrophilic properties, and is also capable of imparting flexibility to the resist film, resulting in improving film performances in alkali developing properties, anti-etching properties, etc.

The polyol compound may include compounds containing at least two hydroxy groups in the molecule. Specific examples thereof may include (poly)methylene glycol, (poly)ethylene glycol, (poly)propylene glycol, 1,4-butanediol, 1,3-butanediol, 2,3-butanediol, 1,2-butanediol, 3-methyl-1,2-butanediol, 1,2-pentanediol, 1,5-pentanediol, 1,4-pentanediol, 2,4-pentanediol, 2,3-dimethyltrimethylene glycol, 3-methyl-4,3-pentanediol, 3-methyl-4,5-pentanediol, 2,2,4-trimethyl-1,3-pentanediol, 1,6-hexanediol, 1,5-hexanediol, 1,4-hexanediol, 2,5-hexanediol, 1,4-cyclohexanediol, neopentyl glycol, pentaerythritol, trimethylol propane, glycelol and the like. These may be used alone or in combination. Of these, the hydroxy compound containing two hydroxy groups in one molecule is preferable.

The photopolymerizable polyurethane compound may be prepared by the same process as in the general polyurethane resin. That is, the photopolymerizable polyurethane compound may be prepared by a process which comprises subjecting a mixture of a carboxyl group-containing polyol compound, polyol compound and polyisocyanate compound at such an excess amount of polyisocyanate group that an isocyanate group to hydroxy group molar ratio is in the range of about 2.0 to 1.1, preferably about 2.0 to 1.2, to addition reaction between isocyanate group and hydroxy group to prepare a carboxyl group-containing isocyanate compound, followed by subjecting a mixture of the carboxyl group-containing isocyanate compound with a photopolymerizable unsaturated group-containing polyol compound at such a mixing ratio that an isocyanate group to hydroxy group molar ratio is in the range of about 0.8 to 1.0, preferably about 0.9 to 1.0, to addition reaction. Otherwise, the carboxyl group may be esterified with lower alcohol such as methanol, ethanol, propanol and the like to be blocked prior to the above addition reaction, followed by heating after reaction to remove the lower alcohol for regenerating the carboxyl group.

The addition reaction between isocyanate group and hydroxy group may be carried out at a reaction temperature usually in the range of 50 to 150° C., but preferably 100° C. or lower so as to prevent polymerization of radically polymerizable unsaturated group. If needed, an urethane-forming reaction catalyst may be used. The urethane-forming reaction catalyst may include organotin compounds such as tin octylate, dibutyltin dilaurate and the like.

The first embodiment of the present invention relates to a liquid photocurable composition containing the above photopolymerizable polyurethane compound, and optionally containing a photopolymerizable compound other than the above photopolymerizable polyurethane compound.

The photopolymerizable compound optionally used as above may preferably include known unsaturated monomers, unsaturated resins or oligmers, etc., containing photopolymerizable unsaturated group in an amount of at least about one on an average, particularly about one to 10 on an average in one molecule, and having a weight average molecular weight in the range of about 100 to 80000, particularly 100 to 5000. Addition of the above photopolymerizable compound makes it possible to control a coating viscosity and to improve film performances required for the resist film, for example, photocurability, developing properties and the like. The photopolymerizable unsaturated group may include any groups taking place the radical polymerization reaction by irradiation without particular limitations. Examples of the photopolymerizable unsaturated group may include vinyl group, (meth)acryloyl group, styryl group, group due to maleic acid and the like.

Examples of the photopolymerizable compound may include alkyl or cycloalkyl ester monomers of (meth)acrylic acid such as methyl (meth)acrylate, ethyl (meth)acrylate, propyl (meth)acrylate, n-butyl (meth)acrylate, isobutyl (meth)acrylate, tert-butyl (meth)acrylate, 2-ethylhexyl (meth)acrylate, cyclohexyl (meth)acrylate, n-octyl (meth)acrylate, lauryl (meth)acrylate, dodecyl (meth)acrylate, stearyl (meth)acrylate, 2-ethylhexyl-carbitol (meth)acrylate, isobornyl (meth)acrylate and the like; alkoxyalkyl ester monomers of (meth)acrylic acid such as methoxybutyl (meth)acrylate, methoxyethyl (meth)acrylate, ethoxybutyl (meth)acrylate, trimethylolpropanol tripropoxy (meth) acrylate and the like; aromatic vinyl monomers such as styrene, α-methylstyrene, vinyl toluene and the like; α, β-ethylenically unsaturated carboxylic acid monomers such as (meth)acrylic acid, maleic acid and the like; acrylic phosphate monomers such as dimethylphosphate ethyl acrylate, diethylphosphate ethyl acrylate and the like; epoxy group-containing unsaturated monomers such as glycidyl (meth)acrylate, 3,4-epoxy-cyclohexyl methyl (meth) acrylate, glycidyl ether and the like; hydroxy group-containing unsaturated monomers such as 2-hydroxyethyl (meth)acrylate, 2-hydroxypropyl (meth)acrylate, 2-hydroxy-3-phenoxypropyl (meth) acrylate, 3-hydroxypropyl (meth)acrylate, hydroxy-butyl (meth)acrylate, (poly) alkylene glycol monoacrylate, adducts of the above monomers with lactones such as ε-caprolactone and the like, and the like; esters of aromatic alcohol with (meth)acrylic acid, for example, benzyl (meth)acrylate and the like; adducts of glycidyl (meth)acrylate or hydroxyalkyl ester of (meth)acrylic acid with monocarboxylic acid compounds such as capric acid, lauric acid, linolic acid, oleic acid and the lkie; adducts of (meth) acrylic acid with monoepoxy compounds such as Cardura E 10 (trade name, marketed by Shell Kagaku K. K.) and the like; chain alkyl vinyl ether such as ethyl vinyl ether, propyl vinyl ether, butyl vinyl ether, hexyl vinyl ether, octyl vinyl ether and the like; cycloalkyl vinyl ether such as cyclopentyl vinyl ether, cyclohexyl vinyl ether, 1,4-cyclohexane dimethanol divinyl ether and the like; allyl ether such as allyl glycidyl ether, allyl ethyl ether and the like; fluorine-containing unsaturated monomer such as perfluorobutyl ethyl (meth)acrylate, perfluoroisononyl ethyl (meth)acrylate, perfluorooctyl ethyl (meth)acrylate and the like; nitrogen-containing unsaturated monomer such as (meth)acryloylmorpholine, 2-vinyl pyridine, 1-vinyl-2-pyrrolidone, vinyl caprolactam, dimethyl (meth)acrylamide, N,N-dimethyl ethyl (meth)acrylate, diacetone acrylamide and the like; polyhydric alcohol-modified polyfunctional monomer such as ethylene glycol di(meth)acrylate, diethylene glycol di(meth)acrylate, triethylene glycol di(meth)acrylate, tetra or more (4–16) polyethylene glycol di(meth)acrylate, propylene glycol di(meth)acrylate, trimethylol propane tri(meth)acrylate, pentaerythritol tetra(meth)acrylate, ethylene glycol diitaconate, ethylene glycol dimaleate and the like; and others such as hydroquinone di(meth)acrylate, resorcinol di(meth)acrylate, pyrogallol (meth)acrylate and the like. These unsaturated compounds may be used alone or in combination.

In addition to the above photopolymerizable unsaturated compounds, the liquid photocurable composition may also contain unsaturated resins prepared by introducing photopolymerizable unsaturated group into resins such as urethane resin, acrylic resin, alkyd resin, polyester resin, silicone resin, fluorocarbon resin, spiran resin, polyether resin, epoxy resin and the like.

Examples of the above unsaturated resins may include urethane resin acrylate, acrylic resin acrylate, acrylic resin malate, alkyd resin acrylate, polyester resin acrylate, polyester resin malate, silicone resin acrylate, fluorocarbon resin acrylate, spiran resin acrylate, polyether resin acrylate, epoxy resin acrylate and the like.

The above unsaturated resin may include, for example, reaction products of hydroxy group-containing resin such as urethane resin, acrylic resin, alkyd resin, polyester resin, silicone resin, fluorocarbon resin, polyether resin and the like with (anhydrous) carboxyl group-containing unsaturated compound such as (meth)acrylic acid, (anhydrous) maleic acid and the like or isocyanate group-containing unsaturated compound such as isocyanate ethyl (meth) acrylate and the like; reaction products of isocyanate group-containing resin such as urethane resin, acrylic resin and the like with hydroxyl group-containing unsaturated monomer such as hydroxyethyl (meth)acrylate and the like; reaction products of epoxy group-containing resin such as acrylic resin as radical (co)polymer of glycidyl (meth)acrylate, epoxy resin as bisphenol-epichlorohydrin type or the like, and the like with a carboxyl group-containing unsaturated compound such as (meth)acrylic acid, maleic acid and the like, and the like. The above reactions may be carried out by a process known in the art.

Examples of the trade names of the above unsaturated resin may include NK Ester A-BPE-4 [marketed by Shin Nakamura Chemical Co., Ltd., trade name, epoxy acrylate, weight average molecular weight: about 512, degree of unsaturation defined as a number of polymerizable unsaturated group per 1000 of molecular weight (hereinafter defined as above): about 2], Actilane 210TP30 (marketed by Nihon Siber Hegner K. K., trade name, urethane acrylate, weight average molecular weight: about 1900, degree of unsaturation: about one), Viscoat #700 (marketed by Osaka Organic Chemical Ind., trade name, polyether acrylate, weight average molecular weight: about 510, degree of unsaturation: about 4), Blue Light UV 7510B (marketed by The Nippon synthetic Chemical Industry Co., Ltd., trade name, urethane acrylate, weight average molecular weight: about 4000, degree of unsaturation: 0.75), Aronix M-110 (marketed by Toagosei Co., Ltd., trade name, weight average molecular weight: 310), Aronix-305 (marketed by Toagosei Co., Ltd., trade name, weight arrange molecular weight: 298), Aronix M-101 (marketed by Toagosei Co., Ltd., trade name, weight average molecular weight: 236), Viscoat #215 (marketed by Osaka Organic Chemical Ind., trade name, weight average molecular weight: 212, neopentyl glycol diacrylate), Kayamer PM2 (marketed by Nippon Kayaku Co., Ltd., trade name, acrylphosphate monomer), and the like.

An amount of the other photopolymerizable compound may be determined depending on purposes to be used, but preferably is in the range of normally about 0 (zero) to 200 parts by weight, preferably about 0 (zero) to 100 parts by weight.

The light defined in the present invention may include actinic radiation such as electron rays, ultraviolet light, visible light and the like. In the case where crosslinking is carried out by irradiation of ultraviolet light or visible light, a radical photopolymerization initiator and optionally a photosensitizer may also be added.

The radical photopolymerization initiator may include ones known in the art, for example, aromatic carbonyl compounds such as benzophenone, benzoin methyl ether, benzoin isopropyl ether, benzylxanthone, thioxanthone, anthraquinone and the like; acetophenones such as acetophenone, propiophenone, α-hydroxyisobutylphenone, α, α'-dichloro-4-phenoxyacetophenone, 1-hydroxy-1-cyclohexylacetophenone, diacetylacetophenone, and the like; organic peroxides such as benzoyl peroxide, t-butylperoxy-2-ethylhexanoate, t-butylhydroperoxide, di-t-butyl-diperoxyisophtharate, 3,3',4,4'-tetra (t-butylperoxycarbonyl)benzophenone and the like; diphenyl halonium salts such as diphenyliodomium bromide, diphenyliodonium chloride and the like; organohalides such as carbon tetrabromide, chloroform, iodoform and the like; heterocyclic and polycyclic compounds such as 3-phenyl-5-isooxazolone, 2,4,6-tris(trichloromethyl)-1,3,5-triazine benzanthrone and the like; azo compounds such as 2,2'-azo (2,4-dimethylvaleronitrile), 2,2'-azobisisobutylonitrile, 1,1'-azobis(cyclohexane-1-carbonitrile), 2,2'-azobis(2-methylbutylonitrile) and the like; iron-allene complex (see European Patent No. 152377), titanocene compound (see Japanese Patent Application Laid-Open No. 221110/88), bisimidazole based compounds; N-arylglycidyl based compounds; acrydine based compounds; combinations of aromatic ketone with aromatic amine; peroxyketal (see Japanese Patent Application Laid-Open No. 321895/94), and the like. Of the above radical photopolymerization initiators, di-t-butyldiperoxyisophthalate, 3,3',4,4'-tetra (t-butylperoxycarbonyl) benzophenone, iron-allene complex and titanocene compound are preferable because of high activity on crosslinking or polymerization.

Trade names of the radical photopolymerization initiator may include Irgacure 651 (marketed by Ciba Geigy Limited, trade name, acetophenone based radical photopolymerization initiator), Irgacure 184 (marketed by Ciba Geigy Limited, trade name, acetophenone based radical photopolymerization initiator), Irgacure 1850 (marketed by Ciba Geigy Limited, trade name, acetophenone based radical photopolymerization initiator), Irgacure 907 (marketed by Ciba Geigy Limited, trade name, aminoalkylphenone based radical photopolymerization initiator), Irgacure 369 (marketed by Ciba Geigy Limited, trade name, aminoalkylphenone based radical photopolymerization initiator), Lucirin TPO (marketed by BASF Ltd., trade name, 2,4,6-trimethylbenzoyl diphenylphosphine oxide), Kayacure DETXS (marketed by Nippon Kayaku Co., Ltd., trade name), CGI-784 (marketed by Coba Geigy Limited, trade name, titanium complex compound), and the like. These may be used alone or in combination.

Examples of photosensitive dyes may include ones based on thioxanthene, xanthene, ketone, thiopyrrylium salt, base styryl, merocyanine, 3-substituted coumarine, 3,4-substituted coumarine, cyanine, acrydine, thiazine, phenothiazine, anthracene, coronene, benzanthracene, perylene, merocyanine, ketocommarine, fumarine, borate, corolysine and the like. These may be used alone or in combination. The borate based photosensitive dyes may include ones disclosed in, for example, Japanese Patent Application Laid-Open Nos. 241338/93, 5885/95 and 225474/95.

The photocurable composition of the present invention optionally contain adhesion promotors, polymerization inhibitors such as hydroquinone, 2,6-di-t-butyl-p-cresol, N,N-diphenyl-p-phenylene diamine and the like, the following nitrogen-containing compounds other than the above, rubber, organic resin fine particles of saturated resin, unsaturated group-containing vinyl polymer and the like, pigments such as color pigment, extender pigment and the like, metallic oxides such as cobalt oxide and the like, plasticizers such as dibutyl phthalate, dioctyl phthalate, tricresyl phosphate, polyethylene glycol, polypropylene glycol and the like, cissing inhibitor, flowability controlling agent, and the like.

The above adhesion promotor is used for improving adhesion of the coating film to the base board, and may include, for example, tetrazoles such as tetrazole, 1-phenyltetrazole, 5-aminotetrazole, 5-amino-1-methyltetrazole, 5-amino-2-phenyltetrazole, 5-mercapto-1-phenyltetrazole, 5-mercapto-1-methyltetrazole, 5-methylthiotetrazole, 5-chloro-1-phenyl-1H-tetrazole, and the like. These may be used alone or in combination.

The above nitrogen-containing compound may be used for improving resolving power of a printer image, and may include nitrogen-containing compounds disclosed in Japanese Patent Application Laid-Open No. 137176/91, for example, benzotriazoles, pyrazoles and the like. These may be used alone or in combination.

The above saturated resin may be used for controlling solubility of the photocurable composition, that is, may be used as an inhibitor for solubility of the resist film in the alkali developing solution, or for solubility in a strong alkali solution, for example, used in removal of the photocured film. Examples thereof may include polyester resin, alkyd resin, (meth) acrylic resin, vinyl resin, epoxy resin, phenol resin, natural resin, synthetic rubber, silicone resin, fluorocarbon resin, polyurethane resin, and the like. These may be used alone or in combination.

The liquid photocurable composition may be coated onto a substrate, for example, a sheet of metals such as aluminum, magnesium, copper, zinc, chrome, nickel, iron and the like or of alloys comprising the above metals, a printed circuit board surface-treated with the above metals, plastic, glass, silicone wafer, carbon, etc. by a coating method such as roller, roll coater, spin coater, curtain roll coater, spray, electrostatic coating, dip coating, silk screen printing and the like, followed by optional setting, and drying to obtain a photocurable resist film.

The surface of the photocurable resist film may be covered with a cover coat layer prior to being exposed to light for curing. The above cover coat layer may be used as a barrier to oxygen in air so that deactivation by oxygen of radicals generated on exposure to light may be controlled, resulting in smoothly proceeding curing of photocurable materials by exposure to light.

The cover coat layer may be formed by covering the surface of a coating film with a resin film having a film thickness of about 1 (one) to 70 $\mu$m and formed from polyester resin such as polyethylene terephothalate and the like, acrylic resin, polyethylene, polyvinyl chloride resin and the like, or by coating to be a dry film thickness of about 0.5 to 5 $\mu$m onto the surface of a coating film an aqueous solution prepared by dissolving or dispersing into water aqueous resins from polyvinyl alcohol, partially saponified product of polyvinyl acetate, polyvinyl alcohol-vinyl acetate copolymer, partially saponified polyvinyl acetate-vinyl acetate copolymer, polyvinyl pyrrolidone, water-soluble polysuccharides polymers such as plurane and the like, respectively basic group, acid group or salt-containing acrylic resin, polyester resin, vinyl resin, epoxy resin and the like, followed by drying. The cover coat layer may preferably be removed after exposure of the surface of the photocurable material to light and prior to the developing treatment. The cover coat layer of the water-soluble polysaccharides polymer or the aqueous resin may be removed with a solvent capable of dissolving or dispersing the above resins, for example, water, aqueous acid solution, aqueous basic solution and the like.

The cover coat layer may be formed by coating onto the photocurable resist film, or by applying onto the photocurable resist film. The cover coat layer may be or may not be removed prior to the developing treatment.

A light source to be used in photocuring may include, for example, respectively ultrahigh pressure, high pressure, moderate pressure, low pressure mercury lamps, chemical lamp, carbon are lamp, xenone lamp, metal halide lamp, tungsten lamp and the like. Various lusers having an oscillating curve in a visible light region. Of these, argon laser having an oscillating curve in 488 nm and YAG-SHG laser having an oscillating curve in 532 nm are preferable.

The liquid photocurable composition of the present invention may be coated or printed onto a substrate, for example, a plastic sheet, metal, glass, wood and the like. The above composition may preferably be used for forming a resist pattern film.

The method of forming the resist pattern onto the substrate by use of the above liquid photocurable composition in the third embodiment of the present invention is explained hereinafter.

The resist pattern in the third embodiment of the present invention may be formed by a method which comprises (1) coating the liquid photocurable composition onto a substrate, and drying to form a photocurable resist film, (2) exposing the photocurable resist film directly to a laser beam or through a negative mark to light for curing so that a resist film having a predetermined printed image can be obtained, and (3) carrying out in alkali developing treatment, removing a non-cured area of the photocurable resist film with an aqueous alkali solution to form a resist pattern on the substrate. Thereafter, a copper layer not covered with the resist film may removed by etching, followed by removing the resist film to obtain a conductor pattern.

Examples of the substrate may include electrical insulating plastic film or plastic plate such as glass-epoxy resin plate, polyethylene terephthalate film, polyimide film and the like; ones prepared by forming an electrically conductive film, for example, by adhering a metal foil of copper, aluminum and the like, or by subjecting metals such as copper, nickel, silver and the like or compounds such as electrically conductive oxides such as indium tin oxide (ITO) and the like to vacuum metallizing, chemical metallizing, plating and the like onto the surface of the above plastic plate or plastic film; cones prepared by forming an electrically conductive film on the surface of a plastic plate or plastic film having a through hole or on the through hole; metal plate such as copper plate and the like, and the like.

In the coating step (1), the liquid photocurable composition is coated onto the surface of the substrate by a coating method such as spray coating, electrostatic coating, spin coating, dip coating, roller coating, curtain flow coating, silk screen printing and the like, followed by optionally setting, and by drying at a temperature in the range of about 50 to 130° C. to form a liquid photocurable film or a photocurable resist film. The resulting photocurable resist film is exposed to light in the following step (2), in which a non-photocurable cover coat known in the art may optionally be applied onto the surface of the photocurable resist film as a barrier to oxygen for preventing inhibition of curing of the photocurable resist film by exposure to light.

The light source used in the above step (2) of exposing to light may preferably include visible light practically used and having a wave length in an emission spectrum of the light of 488 nm as an argon laser or 532 nm as a YAG-SHG laser without being limited thereto.

The washing out of the non-cured resist film in the step (3) of the developing treatment may be carried out by use of an aqueous weak alkali solution prepared by diluting caustic soda, sodium carbonate, caustic potash, ammonia, amine and the like with water. In the case where the cover coat is used, the cover coat may preferably be removed prior to the developing treatment.

In the case where the resist pattern is used as an etching resist base, an exposed and non-circuit copper layer in the resist pattern may be removed by etching by use of an aqueous solution of ferric chloride or cupric chloride. Removal of the resist film may be carried out by use of a strong alkali such as caustic soda and the like or a solvent such as methyl chloride and the like.

The base having the resist pattern may be used as decoration, solder resist base and etching resist base.

In the second embodiment, the present invention provides a water-based photocurable composition prepared by dispersing the liquid photocurable composition containing the photopolymerizable polyurethane compound, and optionally an organic solvent other than the above and the photopolymerizable compound into water.

The dissolution or dispersion of the liquid photocurable composition may be carried out by neutralizing the carboxyl group contained in the photopolymerizable polyurethane compound and optionally used photopolymerizable compound with an alkali as a neutralizing agent.

An amount of carboxyl group in the photocurable composition is such that the photopolymerizable compound preparably has an acid value in the range of about 30 to 700 mgKOH/g, particularly about 40 to 600 mgKOH/g. An acid value less than about 30 has such drawbacks that poor film-removing properties of the non-cured resist film on treating with a developing solution makes it impossible to satisfactorily remove the copper in the following etching step. On the other hand, an acid value more than about 700 has such drawbacks that the cured resist film may easily be removed, resulting in making it impossible to form a satisfactory copper circuit. In the case of the solder resist, an acid value less than about 30 shows poor film-removing properties of the non-cured resist film on treating with the developing solution, and when an acid value is more than about 700 the cured resist film may easily be removed.

Examples of the organic solvent may include ketones, esters, ethers, cellosolves, aromatic hydrocarbons, alcohols, halogenated hydrocarbons and the like.

Examples of the alkali neutralizing agent may include monoethanolamine, diethanolamine, triethylamine, diethylamine, dimethylaminoethanol, cyclohexylamine, ammonia, caustic soda, caustic potash and the like. An amount of the neutralizing agent is generally in the range of 0.2 to 1.0 equivalent, particularly 0.3 to 0.8 equivalent per one equivalent of carboxyl group contained in the photopolymerizable polyurethane compound.

The water-based photocurable composition may also contain the above photopolymerization initiators, photosensitizers, adhesion promoters, polymerization inhibitors such as hydroquinone, 2,6-di-t-butyl-p-cresol, N,N-diphenyl-p-phenylene diamine and the like, saturated resin, organic resin fine particles, pigments such as color pigment, extender pigment and the like, metallic oxides such as cobalt oxide and the like, plasticizers such as dibutyl phthalate, dioctyl phthalate, tricresyl phosphate, polyethylene glycol, polypropylene glycol and the like, cissing inhibitor, flowability controlling agent, and the like.

The water-based photocurable composition may be coated onto a substrate, for example, a sheet of metals such as aluminum, magnesium, copper, zinc, chrome, nickel, iron and the like or of alloys comprising the above metals, a printed circuit board surface-treated with the above metals, plastic, glass, silicone wafer, carbon, etc. by a coating method such as roller, roll coater, spin coater, curtain roll coater, spray coating, electrostatic coating, dip coating, silk screen printing and the like, followed by drying to obtain a photocurable resist film.

In addition to the above, the water-based photocurable composition may also be used as an electrodeposition coating composition.

The electrodeposition coating composition may include a cationic electrodeposition coating composition at a pH in the range of 4 to 7 and an anionic electrodeposition coating composition at a pH in the range of 7 to 9 respectively controlled under the conditions of a solid content bath concentration in the range of 3 to 25% by weight, particularly 5 to 15% by weight.

The electrodeposition coating composition may be coated, for example, onto the surface of a conductor as a substrate by the following process which comprises controlling a pH of the bath and a bath concentration in the above range respectively and a bath temperature in the range of 15° C. to 40° C., preferably 15° C. to 30° C. to prepare an electrodeposition coating bath, followed by dipping the conductor to be coated into the electrodeposition coating bath, and applying a direct current of 5 to 200 V taking the conductor as an anode in the case of an anionic electrodeposition coating composition and taking the conductor as a cathode in the case of a cationic electrodeposition coating composition for 10 seconds to 5 minutes.

The above electrodeposition coating method may also include a double coat electrodeposition coating method, that is, a method which comprises coating an electrodeposition coating composition having a low glass transition temperature onto a substrate, followed by washing with water or by washing with water and drying, and coating an electrodeposition coating composition having a glass transition temperature of 20° C. or higher as disclosed in Japanese Patent Application Laid-Open No. 20873/90.

A dry film thickness of the coating film is preferably in the range of 0.5 to 50 µm, particularly 1 to 15 µm.

After the completion of electrodeposition coating, a coated product may be taken out of the electrodeposition coating bath, followed by washing with water, drying with hot air or the like to remove moisture contained in the electrodeposition coating film. Examples of the conductor may include electrically conductive materials such as metal, carbox, tin oxide and the like, and ones prepared by adhering the above electrically conductive materials onto the surface of a plastic or glass by laminating, plating and the like.

A cover coat layer may also be applied onto the surface of the electrodeposition coating film prior to being cured by exposure to visible light. The cover coat layer may include the same ones as in the liquid photocurable composition. The cover coat layer may preferably be removed prior to subjecting the electrodeposition coating film to developing treatment. The cover coat layer of the water-soluble polysaccharide polymer or the aqueous resin may be removed with a solvent capable of dissolving or dispersing the above resins, for example, water, aqueous acid solution, aqueous basic solution and the like.

The water-based photocurable composition of the present invention may also be used for the preparation of a dry film resist which is prepared by a process which comprises coating the water-based photocurable composition onto a transparent resin film constituting a base film layer and formed from polyester resin such as polyethylene terephthalate and the like, acrylic resin, polyethylene, polyvinyl chloride resin and the like by use of a roll coater, blade coater, curtain flow coater and the like, followed by drying to form a photocurable resist film having a dry film thickness of 0.5 to 5 µm, and applying a protective film onto the surface of the photocurable resist film.

The dry film resist may be used for forming a photocurable resist film onto the above-mentioned substrate by removing the protective film, followed by adhering the photocurable resist film to the above substrate so that the photocurable resist film may face to the substrate by a thermocompression bonding method and the like. The resulting photocurable resist film is then exposed to a visible light and cured depending on a predetermined printed image after removing or without removing the base film layer in the same manner as in the above electrodeposition coating film, followed by subjecting to a developing treatment directly or after removing the base coat layer as the case may be to form the printed image. In the dry film resist, optionally the above-mentioned cover coat layer may be applied between the base film layer and the photocurable resist film. The cove coat layer either may be coated or adhered onto the photocurable resist film. The cover coat layer either may be removed or not may be removed prior to the developing treatment.

The light source used for photocuring and the cover coat layer may be the same ones as used in the liquid photocurable composition of the present invention.

A method of forming a resist pattern on the substrate by use of the water-based photocurable composition in the third embodiment of the present invention is explained hereinbelow.

The resist pattern in the third embodiment of the present invention may also be formed by a method which comprises (1) coating the water-based photocurable composition onto a substrate, and drying to form a photocurable resist film, (2) exposing the photocurable resist film directly to a laser beam or through a negative mask to light for curing so that a resist film having a predetermined printed image can be obtained, and (3) carrying out an alkali developing treatment, removing a non-cured area of the photocurable resist film with an aqueous alkali solution to form a resist pattern on the substrate. Thereafter, a copper layer not covered with the resist film may removed by etching, followed by removing the resist film to obtain a conductor pattern.

The above substrate is the same one as in the liquid photocurable composition of the present invention.

In the coating step (1), the water-based photocurable composition is coated onto the surface of the substrate by a coating method such as spray coating, electrostatic coating, spin coating, dip coating, roller coating, curtain flow coating, silk screen printing, electrodeposition coating and the like, followed by optionally setting, and by drying at a temperature in the range of about 50 to 130° C. to form a liquid photocurable film or a photocurable resist film. The resulting photocurable resist film is exposed to light in the following step (2), in which a non-photocurable cover coat known in the art may optionally be applied onto the surface of the photocurable resist film as a barrier to oxygen for preventing inhibition of curing of the photocurable resist film by exposure to light.

The water-based photocurable composition as an electrodeposition coating composition is subjected to electrodeposition coating, followed by hydro-extracting, air blowing, optionally drying at a temperature in the range of about 50 to 130° C. to form a negative type photocurable resin film or a photocurable resist film.

The above negative type photocurable resin film or the photocurable resist film may preferably has a film thickness in the range of about 0.5 to 100 μm, particularly about one to 50 μm.

The light source used in the step (2) of exposing to light is the same as in the liquid photocurable composition of the present invention.

The washing out of the non-cured resist film in the step (3) of the developing treatment may be carried out by use of an aqueous weak alkali solution prepared by diluting caustic soda, sodium carbonate, caustic potash, ammonia, amine and the like with water. In the case where the cover coat is used, the cover coat may preferably be removed prior to the developing treatment.

In the case where the resist pattern is used as an etching resist base, an exposed and non-circuit copper layer in the resist pattern may be removed by etching by use of an aqueous solution of ferric chloride or cupric chloride. Removal of the resist film may be carried out by use of a strong alkali such as caustic soda and the like or a solvent such as methyl chloride and the like.

The base having the resist pattern may be used as decoration, solder resist base and etching resist base.

Thus, the present invention provides such remarkable effects (1) that a narrow molecular weight distribution provides a uniform solubility in an alkali developing solution and good anti-etching resistance to the etching solution, (2) that ensured introduction of carboxyl group into the resin provides a uniform solubility in the alkali developing solution and good anti-etching resistance to the etching solution, and (3) that good coating film properties and good anti-etching resistance due to the polyurethane linkage provides good anti-alkali developing properties and good anti-etching properties.

EXAMPLE

The present invention is explained more in detail by the following Examples, in which "part" and "%" represent "part by weight" and "% by weight" respectively.

Preparation of Liquid Photocurable Composition

Example 1

| | |
|---|---|
| Photopolymerizable polyurethane compound A (*) | 100 parts |
| Polymerization initiator (**) | 3 parts |
| Photosensitizer (***) | 1.5 parts |

The above formulation was mixed to prepane a photocurable composition of Example 1.

(*) photopolymerizable polyurethane compound:

A: an addition product of a reaction product of one mole of dimethylol butyric acid, one mole of polyethylene glycol having a number average molecular weight of 200 and 3 moles of xylylene diisocyanate with 2 moles of trimethylolpropane diacrylate as represented by the following formula:

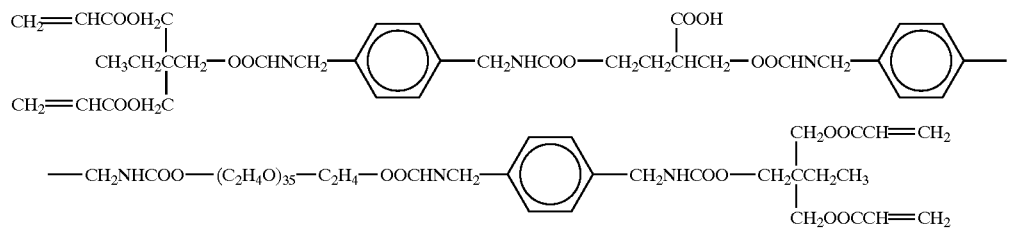

(**) Polymerization initiator: titanocene compound, trade name, CGI-784, marketed by Ciba Geigy Limited.

(***) Photosensitizer LS-1: coumarin based photosensitizer, trade name, NKX-1595, Nippon Kankoshikiso Co., Ltd.

The photocurable composition obtained as above was coated by a bar coater onto a copper-clad glass fiber-reinforced epoxy resin base having a copper layer of 18 μm on its surface, a base thickness of 2 mm and a size of 350×460 mm, followed by drying at 60° C. for 10 minutes to obtain a photocurable resist film having a dry film thickness of 10 μm.

A visible light laser was irradiated onto the photocurable resist film-formed epoxy resin base so as to result a resolution of 100 μm/100 μm [line (μm)/space (μm)] in an irradiation dose of 5 mj/cm$^2$ by use of a 488 nm wave length argon ion laser irradiation apparatus, followed by heating the photocurable resist-formed epoxy resin base at 60° C. for 10 minutes, dipping into a 1% sodium carbonate aqueous solution at 30° C. for one minute to carry out an alkali developing treatment for removing the non-cured area of the photocurable resist film, resulting in forming a resist pattern having a good resolution of 100 μm/100 μm, carrying out etching by dipping into an aqueous 24% ferric chloride solution for 2 minutes to remove an exposed copper layer, resulting in obtaining a good resolution of 100 μm/100 μm.

Example 2

The same photocurable composition as in Example 1 was prepared except that 50 parts of tetraethylene glycol diacrylate was used in place of 50 parts of the photopolymerizable polyurethane compound A to prepare a photocurable composition of Example 2, followed by the same procedures as in Example 1, resulting in forming a resist pattern having a good resolution of 100 μm/100 μm, and in obtaining a good resolution of 100 μm/100 μm by etching.

Example 3

Example 1 was duplicated except that the following photopolymerizable polyurethane compound (B) (*) was used in place of the photopolymerizable polyurethane compound A in Example 1 to prepare a photocurable composition of Example 3 as represented by the following formula:

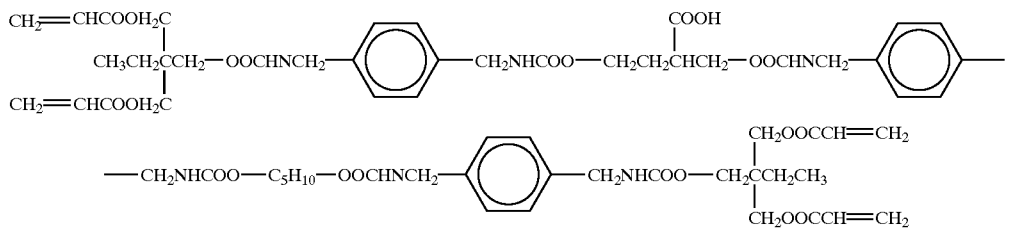

(*) Photopolymerizable polyurethane compound B: an adduct of a reaction product of one mole of dimethylol butyric acid, one mole of propylene glycol and 3 moles of xylylene disocyanate with 2 moles of trimethylolpropane diacrylate. The photocurable composition of Example 3 was subjected to the same procedures as in Example 1 to form a photocurable resist film on the epoxy resin base.

A visible light laser was irradiated onto the photocurable resist film-formed epoxy resin base so as to result a resolution of 100 μm/100 μm [line (μm)/ space (μm)] in an irradiation dose of 5 mj/cm$^2$ by use of a 488 nm wave length argon ion laser irradiation apparatus, followed by heating the photocurable resist-formed epoxy resin base at 60° C. for 10 minutes, dipping into a 1% sodium carbonate aqueous solution at 30° C. for one minute to carry out an alkali developing treatment for removing the non-cured area of the photocurable resist film, resulting in forming a resist pattern having a good resolution of 100 μm/100 μm, carrying out etching by dipping into an aqueous 24% ferric chloride solution for 2 minutes to remove an exposed copper layer, resulting in obtaining a good resolution of 100 μm/100 μm.

Example 4

Example 1 was duplicated except that the following photopolymerizable polyurethane compound (C) (*) was used in place of the photopolymerizable polyurethane compound A in Example 1 to prepare a photocurable composition of Example 4 as represented by the following formula:

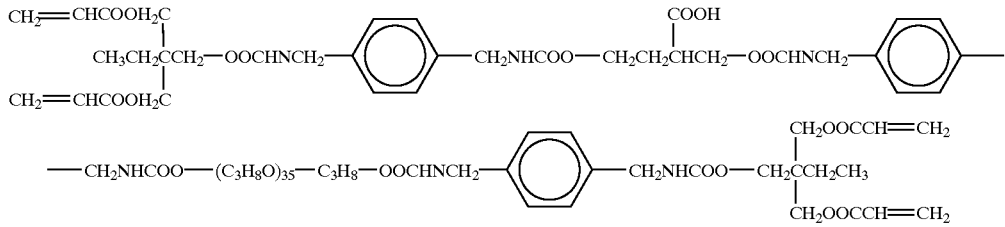

(*) Photopolymerizable polyurethane compound C: an adduct of a reaction product of one mole of dimethylol butyric acid, one mole of 1,5-pentanediol and 3 moles of xylylene diisocyanate with 2 moles of trimethylolpropane diacrylate.

The photocurable composition of Example 4 was subjected to the same procedures as in Example 1 to form a photocurable resist film on the epoxy resin base.

A visible light laser was irradiated onto the photocurable resist film-formed epoxy resin base so as to result a resolution of 100 μm/100 μm [line (μm)/ space (μm)] in an irradiation dose of 5 mj/cm$^2$ by use of a 488 nm wave length argon ion laser irradiation apparatus, followed by heating the photocurable resist-formed epoxy resin base at 60° C. for 10 minutes, dipping into a 1% sodium carbonate aqueous solution at 30° C. for one minute to carry out an alkali developing treatment for removing the non-cured area of the photocurable resist film, resulting in forming a resist pattern having a good resolution of 100 μm/100 μm, carrying out etching by dipping into an aqueous 24% ferric chloride solution for 2 minutes to remove an exposed copper layer, resulting in obtaining a good resolution of 100 μm/100 μm.

Example 5

| Photopolymerizable polyurethane compound A | 100 parts |
|---|---|
| Polymerization initiator A (****) | 10 parts |
| Polymerization initiator B (*****) | 2 parts |

The above formulation was mixed to prepare a photocurable composition of Example 5.
(****) Polymerization initiator A: aminoalkylphenone based photoradical polymerization initiator, trade name, Irgacure 907, marketed by Ciba Geigy Limited.
(*****) Polymerization initiator B: thioxanthone based photoradical polymerization initiator, trade name, Kayacure DETX-S, marketed by Nippon Kayaku Co., Ltd.

The photocurable composition obtained as above was coated by a bar coater onto a copper-clad glass film-reinforced epoxy resin base having a copper layer of 18 μm on its surface, a base thickness of 2 mm and a size of 350×460 mm, followed by drying at 60° C. for 10 minutes to obtain a photocurable resist film having a dry film thickness of 10 μm.

A light was irradiated onto the photocurable resist film-formed epoxy resin base so as to result a resolution of 100 μm/100 μm [line (μm)/ space (μm)] in an irradiation dose of 100 μm/cm$^2$ by use of an ultrahigh pressure mercury lamp, followed by heating the photocurable resist-formed epoxy resin base at 60° C. for 10 minutes, dipping into a 1% sodium carbonate aqueous solution at 30° C. for one minute to carry out an alkali developing treatment for removing the non-cured area of the photocurable resist film, resulting in forming a resist pattern having a good resolution of 100 μm/100 μm, carrying out etching by dipping into an aqueous 24% ferric chloride solution for 2 minutes to remove an exposed copper layer, resulting in obtaining a good resolution of 100 μm/100 μm.

Example 6

| Photopolymerizable polyurethane compound A | 100 parts |
|---|---|
| Polymerization initiator A (****) | 5 parts |
| Polymerization initiator B (*****) | 1 part |
| Phthalocyanine green | 1 part |
| Talc | 50 parts |
| Epoxy resin (******) | 20 parts |

The above formulation was dispersed and mixed to prepare a photocurable composition of Example 6.
(****) Polymerization initiator A: aminoalkylphenone based photoradical polymerization initiator, trade name, Irgacure 907, marketed by Ciba Geigy Limited.
(*****) Polymerization initiator B: thioxanthone based photoradical polymerization initiator, trade name, Kayacure DETX-S, marketed by Nippon Kayaku Co., Ltd.
(******) Epoxy resin: bisphenol A type liquid epoxy resin, trade name, Epikote 828, marketed by Yuka Shell Co., Ltd.

The photocurable composition obtained as above was coated by a bar coater onto a copper-clad glass fiber-reinforced epoxy resin base having a copper layer of 18 μm on its surface, a base thickness of 2 mm and a size of 350×460 mm, followed by drying at 80° C. for 10 minutes to obtain a photocurable resist film having a dry film thickness of 50 μm.

A light was irradiated onto the photocurable resist film-formed epoxy resin base so as to result a resolution of 100 μm/100 μm [line (μm)/space (μm)] in an irradiation dose of 100 mj/cm$^2$ by use of an ultrahigh pressure mercury lamp, followed by dipping into a 1% sodium carbonate aqueous solution at 30° C. for one minute to carry out an alkali developing treatment for removing the non-cured area of the photocurable resist film, resulting in forming a resist pattern having a good resolution of 100 μm/100 μm.

Example 7

To the photocurable composition of Example 6 was added 50 parts of poly(1–10)ethylene glycol dimethacrylate to obtain a photocurable composition of Example 7, followed by obtaining a photocurable resist film in the same manner as in Example 6, and subjecting to an alkali developing treatment to obtain a resist pattern having a good resolution of 100 μm/100 μm.

Comparative Example 1

A mixture of 40 parts of methyl methacrylate, 40 parts of butyl acrylate, 20 parts of acrylic acid and 2 parts of azobisisobutyronitrile was dropped into 90 parts of propylene glycol monomethyl ether at 100° C. over 3 hours under nitrogen atmosphere. Completion of dropping was followed by aging for one hour, dropping a mixture of one part of azobisdimethylvaleronitrile and 10 parts of propylene glycol monomethyl ether over one hour, aging for 5 hours to obtain a high acid value acrylic resin (resin acid value: 155 mgKOH/g) solution, adding 24 parts of glycidyl methacrylate, 0.12 part of hydroquinone and 0.6 part of tetraethylammonium bromide, and reacting at 100° C. for 5 hours introducing air to obtain a photocurable resin solution having a solid content of about 55.4%. The resulting resin had a resin acid value of about 50 mgKOH/g and a number average molecular weight of about 20,000.

Example 1 was duplicated except that the above photocurable resin solution was used in place of the photopolymerizable polyurethane compound A in Example 1 in the same amount as the compound A as the solid content to obtain a photocurable composition of Comparative Example 1.

The above photocurable composition was subjected to the same procedures as in Example 1 to obtain a photocurable resist film on the epoxy resin base.

A visible light laser was irradiated onto the photocurable resist film-formed epoxy resin base so as to result a resolution of 100 μm/100 μm [line (μm)/space (μm)] in an irradiation dose of 5 mj/cm$^2$ by use of a 488 nm wave length argon ion laser irradiation apparatus, followed by heating the photocurable resist-formed epoxy resin base at 60° C. for 10 minutes, dipping into a 1% sodium carbonate aqueous solution at 30° C. for one minute to carry out an alkali developing treatment for removing the non-cured area of the photocurable resist film, carrying out etching by dipping into an aqueous 24% ferric chloride solution for 2 minutes, resulting in that separation of the resist film during etching made it impossible to obtain a resolution of 100 μm/100 μm.

Comparative Example 2

Example 1 was duplicated except that the following photocurable resin solution was used in place of the photopolymerizable polyurethane compound A in Example 1 in the same amount as the compound A as the solid content to obtain a photocurable composition of Comparative Example 2.

The photocurable resin was prepared by a process which comprises heating a mixture of 134 parts of dimethylol propionic acid, 366 parts of ε-caprolactone and 0.15 part of stannous chloride, reacting for about 10 hours, cooling down to 60° C., adding 333.4 parts of isophorone diisocyanate and, as a diluent, 409.4 parts of polyethylene glycol diacrylate (marketed by Nippon Kayaku Co., Ltd., Kayarad PEG400DA, trade name), reacting at 80° C. for about 10 hours, adding 121.8 parts of 2-hydroxyethyl acrylate and 0.6 part of p-methoxyphenol, and reacting at 80° C. for about 15 hours to obtain an urethane acrylate containing 30% of polyethylene glycol diacrylate.

The above photocurable composition was subjected to the same procedures as in Example 1 to obtain a photocurable resist film.

A visible light laser was irradiated onto the photocurable resist film-formed epoxy resin base so as to result a resolution of 100 μm/100 μm [line (μm)/space (μm)] in an irradiation dose of 5 mj/cm² by use of a 488 nm wave length argon ion laser irradiation apparatus, followed by heating the photocurable resist-formed epoxy resin base at 60° C. for 10 minutes, and dipping into a 1% sodium carbonate aqueous solution at 30° C. for one minute to carry out an alkali developing treatment for removing the non-cured area of the photocurable resist film, without obtaining a satisfactorily cured resist film.

Comparative Example 3

A mixture of 40 parts of methyl methacrylate, 40 parts of butyl acrylate, 20 parts of acrylic acid and 2 parts of azobisisobutyronitrile was dropped into 90 parts of propylene glycol monomethyl ether at 110° C. over 3 hours under nitrogen atmosphere. Completion of dropping was followed by aging for one hour, dropping a mixture of one part of azobisdimethylvaleronitrile and 10 parts of propylene glycol monomethyl ether over one hour, aging for 5 hours to obtain a high acid value acrylic resin (resin acid value: 155 mgKOH/g) solution, adding 24 parts of glycidyl methacrylate, 0.12 part of hydroquinone and 0.6 part of tetraethylammonium bromide, and reacting at 110° C. for 5 hours intorducing air to obtain a photocurable resin solution having a solid content of about 55.4%. The resulting resin had a resin acid value of about 50 mgKOH/g and a number average molecular weight of about 20,000.

Example 6 was duplicated except that the above photocurable resin solution was used in place of the photopolymerizable polyurethane compound A in Example 6 in the same amount as the compound A as the solid content to obtain a photocurable composition of Comparative Example 3.

The above photocurable composition was subjected to the same procedures as in Example 6 to obtain a photocurable solder resist film.

The photocurable composition obtained as above was coated by a bar coater onto a copper-clad glass fiber-reinforced epoxy resin base having a copper layer of 18 μm on its surface, a base thickness of 2 mm and a size of 350×460 mm, followed by drying at 60° C. for 10 minutes to obtain a photocurable resist film having a dry film thickness of 10 μm.

A light was irradiated onto the photocurable resist film-formed epoxy resin base so as to result a resolution of 100 μm/100 μm [line (μm)/space (μm)] in an irradiation dose of 100 mj/cm² by use of an ultrahigh pressure mercury lamp, followed by dipping into a 1% sodium carbonate aqueous solution at 30° C. for one minute to carry out an alkali developing treatment for removing the non-cured area of the photocurable resist film, resulting in producing a remaining photocurable resist film without being removed, and in making it impossible to obtain a resist pattern having a resolution of 100 μm/100 μm.

Preparation of Water-Based Photocurable Composition:

Example 8

To the photocurable composition of Example 1 was added 4.5 parts of triethylamine for neutralizing, followed by dispersing into water to prepare a water-based photocurable composition having a solid content of 20%.

The water-based photocurable composition obtained as above was coated by a bar coater onto a copper-clad glass fiber-reinforced epoxy resin base having a copper layer of 18 μm on its surface, a base thickness of 2 mm and a size of 350×460 mm, followed by drying at 60° C. for 10 minutes to obtain a photocurable resist film having a dry film thickness of 10 μm.

A visible light laser was irradiated onto the photocurable resist film-formed epoxy resin base so as to result a resolution of 100 μm/100 μm [line (μm)/space (μm)] in an irradiation dose of 5 mj/cm² by use of a 488 nm wave length argon ion laser irradiation apparatus, followed by heating the photocurable resist-formed epoxy resin base at 60° C. for 10 minutes, dipping into a 1% sodium carbonate aqueous solution at 30° C. for one minutes to carry out an alkali developing treatment for removing the non-cured area of the photocurable resist film, resulting in forming a resist pattern having a good resolution of 100 μm/100 μm, carrying out etching by dipping into an aqueous 24% ferric ckloride solution for 2 minutes to remove an exposed copper layer, resulting in obtaining a good resolution of 100 μm/100 μm.

Example 9

To the photocurable composition of Example 2 was added 5.7 parts of triethylamine for neutralizing, followed by dispersing into water to prepare a water-based photocurable composition having a solid content of 20%.

The water-based photocurable composition was subjected to the same procedures as in Example 8 to obtain a photocurable resist film.

A visible light laser was irradiated onto the photocurable resist film-formed epoxy resin base so as to result a resolution of 100 μm/100 μm [line (μm)/space (μm)] in an irradiation dose of 5 mj/cm² by use of a 488 nm wave length argon ion laser irradiation apparatus, followed by heating the photocurable resist-formed epoxy resin base at 60° for 10 minutes, dipping into a 1% sodium carbonate aqueous solution at 30° C. for one minute to carry out an alkali developing treatment for removing the non-cured area of the photocurable resist film resulting in forming a resist pattern having a good resolution of 100 μm/100 μm, carrying out etching by dipping into an aqueous 24% ferric chloride solution for 2 minutes to remove an exposed copper layer, resulting in obtaining a good resolution of 100 μm/100 μm.

Example 10

To the photocurable composition of Example 3 was added 5.9 parts of triethylamine for neutralizing, followed by dispersing into water to prepare a water-based photocurable composition having a solid content of 20%.

The water-based photocurable composition was subjected to the same procedures as in Example 8 to obtain a photocurable resist film.

A visible light laser was irradiated onto the photocurable resist film-formed epoxy resin base so as to result a resolution of 100 μm/100 μm [line (μm)/space (μm)] in an irradiation dose of 5 mj/cm² by use of a 488 nm wave length argon ion laser irradiation apparatus, followed by heating the photocurable resist-formed epoxy resin base at 60° C. for 10 minutes, dipping into a 1% sodium carbonate aqueous solution at 30° C. for one minute to carry out an alkali developing treatment for removing the non-cured area of the photocurable resist film, resulting in forming a resist pattern having a good resolution of 100 μm/100 μm, carrying out etching by dipping into an aqueous 24% ferric chloride solution for 2 minutes to remove an exposed copper layer, resulting in obtaining a good resolution of 100 μm/100 μm.

Example 11

To the photocurable composition of Example 4 was added 5.7 parts of triethylamine for neutralizing, followed by dispersing into water to prepare a water-based photocurable composition having a solid content of 20%.

The water-based photocurable composition was subjected to the same procedures as in Example 8 to obtain a photocurable resist film.

The water-based photocurable composition obtained as above was coated by a bar coater onto a copper-clad glass fiber-reinforced epoxy resin base having a copper layer of 18 μm on its surface, a base thickness of 2 mm and a size of 350×460 mm, followed by drying at 60° C. for 10 minutes to obtain a photocurable resist film having a dry film thickness of 10 μm.

A light was irradiated onto the photocurable resist film-formed epoxy resin base so as to result a resolution of 100 μm/100 μm [line (μm)/space (μm)] in an irradiation dose of 100 mj/cm$^2$ by use of an ultrahigh pressure mercury lamp, followed by heating the photocurable resist-formed epoxy resin base at 60° C. for 10 minutes, dipping into a 1% sodium carbonate aqueous solution at 30° C. for one minute to carry out an alkali developing treatment for removing the non-cured area of the photocurable resist film, resulting in forming a resist pattern having a good resolution of 100 μm/100 μm, carrying out etching by dipping into an aqueous 24% ferric chloride solution for 2 minutes to remove an exposed copper layer, resulting in obtaining a good resolution of 100 μm/100 μm.

Example 12

To the photocurable composition of Example 5 was added 4.5 parts of triethylamine for neutralizing, followed by dispersing into water to prepare a water-based photocurable composition having a solid content of 20%.

The water-based photocurable composition was subjected to the same procedures as in Example 8 to obtain a photocurable resist film.

The water-based photocurable composition obtained as above was coated by a bar coater onto a copper-clad glass fiber-reinforced epoxy resin base having a copper layer of 18 μm on its surface, a base thickness of 2mm and a size of 350×460 mm, followed by drying at 80° C. for 10 minutes to obtain a photocurable resist film having a dry film thickness of 50 μm.

A light was irradiated onto the photocurable resist film-formed epoxy resin base so as to result a resolution of 100 μm/100 μm [line (μm)/space (μm)] in an irradiation dose of 100 mj/cm$^2$ by use of an ultrahigh pressure mercury lamp, followed by dipping into a 1% sodium carbonate aqueous solution at 30° C. for one minute to carry out an alkali developing treatment for removing the non-cured area of the photocurable resist film, resulting in forming a resist pattern having a good resolution of 100 μm/100 μm.

Example 13

To the photocurable composition of Example 6 was added 4.5 parts of triethylamine for neutralizing, followed by dispersing into water to prepare a water-based photocurable composition having a solid content of 20%.

The water-based photocurable composition obtained as above was coated by a bar coater onto a copper-clad glass fiber-reinforced epoxy resin base having a copper layer of 18 μm on its surface, a base thickness of 2 mm and a size of 350×460 mm, followed by drying at 80° C. for 10 minutes to obtain a photocurable resist film having a dry film thickness of 50 μm.

A light was irradiated onto the photocurable resist film-formed epoxy resin base so as to result a resolution of 100 μm/100 μm [line (μm)/space (μm)] in an irradiation dose of 100 mj/cm$^2$ by use of an ultrahigh pressure mercury lamp, followed by dipping into a 1% sodium carbonate aqueous solution at 30° C. for one minute to carry out an alkali developing treatment for removing the non-cured area of the photocurable resist film, resulting in forming a resist pattern having a good resolution of 100 μm/100 μm.

Example 14

To the photocurable composition of Example 7 was added 5.7 parts of triethylamine for neutralizing, followed by dispersing into water to prepare a water-based photocurable composition having a solid content of 20%.

The water-based photocurable composition obtained as above was coated by a bar coater onto a copper-clad glass fiber-reinforced epoxy resin base having a copper layer of 18 μm on its surface, a base thickness of 2 mm and a size of 350×460 mm, followed by drying at 80° C. for 10 minutes to obtain a photocurable resist film having a dry film thickness of 50 μm.

A light was irradiated onto the photocurable resist film-formed epoxy resin base so as to result a resolution of 100 μm/100 μm [line (μm)/space (μm)] in an irradiation dose of 100 mj/cm$^2$ by use of an ultrahigh pressure mercury lamp, followed by dipping into a 1% sodium carbonate aqueous solution at 30° C. for one minute to carry out an alkali developing treatment for removing the non-cured area of the photocurable resist film, resulting in forming a resist pattern having a good resolution of 100 μm/100 μm.

Comparative Example 4

Example 1 was duplicated except that the following water-based photocurable composition was used in place of the photopolymerizable polyurethane compound A in Example 8 in the same amount as the compound A as the solid content to obtain a photocurable composition of Comparative Example 4.

The water-based photocurable composition was prepared by a process which comprises charging a mixture of 334 parts of polyesterdiol (polymethylpentane adipate, marketed by Kuraray Co., Ltd., number average molecular weight: 2000), 24.3 parts of glycerol monoacrylate, 44.7 parts of 2,2-dimethylol propionic acid, 0.52 part of hydroquinone monomethyl ether, and 0.26 part of dibutyltin dilaurate, adding 185 parts of isophorone diisocyanate with agitation introducing a dry air, heating at 80° C. for reacting for 6 hours to obtain an intermediate having an isocyanate group content of 1.30% by weight, adding 34.8 parts of 2-hydroxyethyl acrylate, reacting at 80° C. for 15 hours to obtain an urethane resin containing a radically polymerizable unsaturated group having an isocyanate group content of 0.16% by weight and an anionic, hydrophilic group, cooling down to 40° C., adding 33.7 parts of triethylamine, uniformly mixing with agitation to form a resin solution, introducing the resin solution into a five liter four-necked flask charged with 1503 parts of deionized water at 50° to make water-soluble, and subjecting to desolvating of methyl ethyl ketone under vacuum to obtain a light yellow, transparent, water-soluble, photocurable resin solution having a nonvolatile content of 30% by weight.

The water-based photocurable composition obtained as above was subjected to the same procedures as in Example 8 to obtain a photocurable resist film.

A visible light laser was irradiated onto the photocurable resist film-formed epoxy resin base so as to result a resolution of 100 μm/100 μm [line (μm)/space (μm)] in an irradiation dose of 5 mj/cm² by use of a 488 nm wave length argon ion laser irradiation apparatus, followed by heating the photocurable resist-formed epoxy resin base at 60° C. for 10 minutes, and dipping into a 1% sodium carbonate aqueous solution at 300° C. for one minute to carry out an alkali developing treatment for removing the non-cured area of the photocurable resist film, without obtaining a satisfactorily cured resist film.

What is claimed is:

1. A water-based photocurable composition prepared by dispersing a liquid photocurable composition containing a photopolymerizable polyurethane compound having a repeating unit represented by the following formula: B—[X]$_n$[Y]$_m$—B,
where X is represented by the formula:

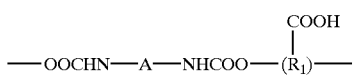

and Y is represented by the formula: —OOCHN—A—NHCOO($R_2$)—, wherein A is a structural unit derived from a polyisocyanate compound, B is same or different and a structural unit derived from a hydroxy compound having at least one photopolymerizable unsaturated group at molecular terminals, respectively, and optionally containing an ether linkage, $R_1$ is a structural unit derived from a carboxyl group-containing polyol compound, $R_2$ is a structural unit derived from a polyol compound, n is an integer of 1 to 10, m is an integer of 1 to 10, provided that one X and one Y are bonded to each other, or three or more of X and/or Y are bonded to each other, and optionally containing a photopolymerizable compound other than the photopolymerizable polyurethane compound, the carboxyl group-containing polyol compound being dimethylol butyric acid.

2. The composition as claimed in claim 1, wherein the hydroxy compound has two photopolymerizable unsaturated groups at molecular terminals respectively.

3. The composition as claimed in claim 1, wherein said composition further contains a titanocene compound as a polymerization initiator.

4. The composition as claimed in claim 1, wherein said composition further contains a photosensitizer.

5. An electrodeposition coating composition prepared by dispersing into water a liquid photocurable composition containing a photopolymerizable polyurethane compound having a repeating unit represented by the following formula: B—[X]$_n$[Y]$_m$—B,
where X is represented by the formula:

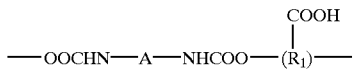

and Y is represented by the formula: —OOCHN—A—NHCOO($R_2$)—, wherein A is a structural unit derived from a polyisocyanate compound, B is same or different and a structural unit derived from a hydroxy compound having at least one photopolymerizable unsaturated group at molecular terminals, respectively, and optionally containing an ether linkage, $R_1$ is a structural unit derived from a carboxyl group-containing polyol compound, $R_2$ is a structural unit derived from a polyol compound, n is an integer of 1 to 10, m is an integer of 1 to 10, provided that one X and one Y are bonded to each other, or three or more of X and/or Y are bonded to each other, and optionally containing a photopolymerizable compound other than the photopolymerizable polyurethane compound, the carboxyl group-containing polyol compound being dimethylol butyric acid.

6. The composition as claimed in claim 5, wherein said composition further contains a titanocene compound as a polymerization initiator.

7. A method of forming a resist pattern comprising the following steps: (1) costing the water-based photocurable coating composition as claimed in claim 1, onto a substrate to form a photocurable resist film; (2) exposing the photocurable resist film directly or through a negative mask to a visible light laser for curing so that a resist film having a predetermined printed image can be formed; and (3) carrying out an alkali developing treatment to form a resist pattern on the substrate.

8. A method of forming a resist pattern comprising the following steps: (1) subjecting the electrodeposition coating composition as claimed in claim 5, to electrodeposition coating onto a substrate to form a photocurable resist film; (2) exposing the photocurable resist film directly or through a negative mask to a visible light laser for curing so that a resist film having a predetermined printed image can be formed; and (3) carrying out an alkali developing treatment to form a resist pattern on the substrate.

9. A method of forming a resist pattern comprising the following steps: (1) coating the water-based photocurable coating composition as claimed in claim 3 onto a substrate to form a photocurable resist film; (2) exposing the photocurable resist film directly or through a negative mask to a visible light laser for curing so that a resist film having a predetermined printed image can be formed; and (3) carrying out an alkali developing treatment to form a resist pattern on the substrate.

10. A method of forming a resist pattern comprising the following steps:

(1) subjecting the electrodeposition coating composition as claimed in claim 6 to electrodeposition coating onto a substrate to form a photocurable resist film;

(2) exposing the photocurable resist film directly or through a negative mask to a visible light laser for curing so that a resist film having a predetermined printed image can be formed; and (3) carrying out an alkali developing treatment to form a resist pattern on the substrate.

* * * * *